United States Patent
Kitou et al.

(10) Patent No.: US 8,470,091 B2
(45) Date of Patent: Jun. 25, 2013

(54) SIC SINGLE CRYSTAL SUBSTRATE, SIC SINGLE CRYSTAL EPITAXIAL WAFER, AND SIC SEMICONDUCTOR DEVICE

(75) Inventors: Yasuo Kitou, Okazaki (JP); Hiroki Watanabe, Obu (JP); Masanori Nagaya, Kariya (JP); Kensaku Yamamoto, Chiryu (JP); Eiichi Okuno, Mizuho (JP)

(73) Assignee: DENSO CORPORATION, Kariya (JP)

( * ) Notice: Subject to any disclaimer, the term of this patent is extended or adjusted under 35 U.S.C. 154(b) by 473 days.

(21) Appl. No.: 12/656,210

(22) Filed: Jan. 21, 2010

(65) Prior Publication Data

US 2010/0200866 A1    Aug. 12, 2010

(30) Foreign Application Priority Data

Feb. 12, 2009    (JP) .................................. 2009-29825

(51) Int. Cl.
*H01L 29/24* (2006.01)
(52) U.S. Cl.
USPC ................. 117/101; 117/84; 117/89; 257/77; 257/617; 438/478; 438/481
(58) Field of Classification Search
USPC ....................... 257/77; 117/84, 101
See application file for complete search history.

(56) References Cited

U.S. PATENT DOCUMENTS

| | | | | |
|---|---|---|---|---|
| 4,912,064 A * | 3/1990 | Kong et al. | ................... | 438/507 |
| 5,011,549 A * | 4/1991 | Kong et al. | ................... | 148/33.1 |
| 5,230,768 A * | 7/1993 | Furukawa et al. | ............ | 117/101 |
| 5,915,194 A * | 6/1999 | Powell et al. | ................... | 438/478 |
| 6,225,650 B1 * | 5/2001 | Tadatomo et al. | ............ | 257/190 |
| 6,488,771 B1 * | 12/2002 | Powell et al. | ................... | 117/89 |
| 6,641,938 B2 * | 11/2003 | Landini et al. | ................. | 428/698 |
| 6,703,288 B2 * | 3/2004 | Nagasawa et al. | ............ | 438/483 |
| 6,716,724 B1 * | 4/2004 | Iyechika et al. | ............... | 438/481 |
| 6,734,461 B1 * | 5/2004 | Shiomi et al. | .................... | 257/77 |

(Continued)

FOREIGN PATENT DOCUMENTS

| | | |
|---|---|---|
| JP | A-2004-262709 | 9/2004 |
| JP | A-2008-115034 | 5/2008 |
| JP | 2009-029584 | 2/2009 |
| WO | WO 2008/089181 A2 | 7/2008 |

OTHER PUBLICATIONS

S. Ha et al., Dislocation conversion in 4H silicon carbide epitaxy, Journal of Crystal Growth 244 (2002) p. 257-266.*

(Continued)

*Primary Examiner* — Cheung Lee
*Assistant Examiner* — William Harriston
(74) *Attorney, Agent, or Firm* — Posz Law Group, PLC

(57) ABSTRACT

A direction of a dislocation line of a threading dislocation is aligned, and an angle between the direction of the dislocation line of the threading dislocation and a [0001]-orientation c-axis is equal to or smaller than 22.5 degrees. The threading dislocation having the dislocation line along with the [0001]-orientation c-axis is perpendicular to a direction of a dislocation line of a basal plane dislocation. Accordingly, the dislocation does not provide an extended dislocation on the c-face, so that a stacking fault is not generated. Thus, when an electric device is formed in a SiC single crystal substrate having the direction of the dislocation line of the threading dislocation, which is the [0001]-orientation c-axis, a SiC semiconductor device is obtained such that device characteristics are excellent without deterioration, and a manufacturing yield ration is improved.

10 Claims, 6 Drawing Sheets

U.S. PATENT DOCUMENTS

| | | | |
|---|---|---|---|
| 6,869,480 B1* | 3/2005 | Abel et al. | 117/89 |
| 6,890,600 B2 | 5/2005 | Nakamura et al. | |
| 7,164,187 B2* | 1/2007 | Nagasawa | 257/617 |
| 7,230,274 B2* | 6/2007 | O'Loughlin et al. | 257/77 |
| 7,314,520 B2 | 1/2008 | Powell et al. | |
| 7,365,363 B2* | 4/2008 | Kojima et al. | 257/77 |
| 7,531,433 B2* | 5/2009 | Ellison et al. | 438/478 |
| 7,968,892 B2* | 6/2011 | Kojima et al. | 257/76 |
| 8,053,806 B2* | 11/2011 | Kyono et al. | 257/102 |
| 2004/0159841 A1* | 8/2004 | Hisada et al. | 257/77 |
| 2004/0164380 A1* | 8/2004 | Nagasawa | 257/617 |
| 2005/0181536 A1* | 8/2005 | Tsuji | 438/105 |
| 2006/0075958 A1 | 4/2006 | Powell et al. | |
| 2006/0289873 A1* | 12/2006 | Rowland et al. | 257/77 |
| 2007/0001175 A1 | 1/2007 | Kojima et al. | |
| 2007/0290211 A1* | 12/2007 | Nakayama et al. | 257/77 |
| 2008/0079008 A1* | 4/2008 | Yonezawa et al. | 257/77 |
| 2008/0318359 A1* | 12/2008 | Yonezawa et al. | 438/105 |
| 2010/0089311 A1* | 4/2010 | Ohtani et al. | 117/84 |
| 2010/0199910 A1* | 8/2010 | Watanabe et al. | 117/95 |
| 2011/0006309 A1* | 1/2011 | Momose et al. | 257/77 |
| 2011/0198693 A1* | 8/2011 | Shiomi et al. | 257/339 |
| 2011/0220915 A1* | 9/2011 | Edgar et al. | 257/77 |

OTHER PUBLICATIONS

Office Action mailed on Apr. 26, 2011 issued from the Japanese Patent Office in the corresponding Japanese Patent Application No. 2009-029825 (English translation enclosed).

J. Takahashi et al., "Structural defects in α-SiC single crystals grown by the modified-Lely method," *Journal of Crystal Growth*, pp. 596-606 (Oct. 1, 1996).

U.S. Appl. No. 12/702,535, filed Feb. 9, 2010, Watanabe.

Z. Zhang and T.S. Sudarshan. "Evolution of basal plane dislocations during 4H-silicon carbide homeopitaxy," Applied Physics Letters vol. 87, #16 p. 161917-161917-3, Oct. 4, 2005.

Office Action dated Nov. 23, 2010 issued in corresponding SE application No. 1000082.6.

Office Action dated Mar. 15, 2013 in corresponding SE Patent Application No. 1000082-6 (and English translation).

* cited by examiner

SIC SINGLE CRYSTAL SUBSTRATE, SIC SINGLE CRYSTAL EPITAXIAL WAFER, AND SIC SEMICONDUCTOR DEVICE

CROSS REFERENCE TO RELATED APPLICATION

This application is based on Japanese Patent Application No. 2009-29825 filed on Feb. 12, 2009, the disclosure of which is incorporated herein by reference.

FIELD OF THE INVENTION

The present invention relates to a SiC single crystal substrate, a SiC single crystal epitaxial wafer and a SiC semiconductor device.

BACKGROUND OF THE INVENTION

Conventionally, a SiC single crystal wafer having high quality is disclosed in the patent documents No. 1 and No. 2. The SiC single crystal wafer, disclosed in the patent documents No. 1 and No. 2 is suitably used for processing a device under a condition that a density of dislocations, which negatively affects on device characteristics, is equal to or smaller than a certain value. Here, the dislocation is a crystal defect along with a line. The types of dislocations as an object are a basal plane dislocation disposed on a (0001)-plane face (i.e., C-face) and a threading screw dislocation in parallel to a C-axis.
[Patent document No. 1] JP-A-2008-115034
[Patent document No. 2] JP-A-2008-515748 corresponding to U.S. Pat. No. 7,314,520

However, the patent documents No. 1 and No. 2 do not teach a threading edge dislocation, and thereby, influence of the threading edge dislocation on the device is not clear. Thus, the threading screw dislocation and the threading edge dislocation (both are defined as threading dislocation) cause device characteristics of a diode and a transistor to be deteriorated, and/or reduce manufacturing yield ratio. Thus, it is important to reduce the density of dislocations. Although the patent documents No. 1 and No. 2 teaches the types of dislocations and density thereof, a direction of a dislocation line of a threading dislocation is not clear.

Here, the threading screw dislocation and the threading edge dislocation have different directions of distortion (i.e., different Burgers vectors). The direction of distortion in the threading screw dislocation is in parallel to the C-axis, and the direction of distortion in the threading edge dislocation is perpendicular to the C-axis. The direction of distortion in a basal plane dislocation includes both of the directions of dislocation in the screw dislocation and the edge dislocation.

SUMMARY OF THE INVENTION

In view of the above-described problem, it is an object of the present disclosure to provide a silicon carbide single crystal substrate, which define a direction of a dislocation line in a threading dislocation so that deterioration of device characteristics and reduction of a manufacturing yield ratio are limited. It is another object of the present disclosure to provide a silicon carbide single crystal epitaxial wafer, which define a direction of a dislocation line in a threading dislocation so that deterioration of device characteristics and reduction of a manufacturing yield ratio are limited. It is another object of the present disclosure to provide a silicon carbide semiconductor device in a silicon carbide single crystal substrate or a silicon carbide single crystal epitaxial wafer, which define a direction of a dislocation line in a threading dislocation so that deterioration of device characteristics and reduction of a manufacturing yield ratio are limited.

According to a first aspect of the present disclosure, a silicon carbide single crystal substrate includes: a threading dislocation with a dislocation line, which penetrates a (0001)-plane c-face. An angle between the direction of the dislocation line of the threading dislocation and a [0001]-orientation c-axis is equal to or smaller than 22.5 degrees.

When the SiC single crystal substrate having the direction of the dislocation line of the threading dislocation being equal to the [0001]-orientation c-axis is used, and the electric device is formed in the SiC single crystal substrate, the SiC semiconductor device is formed such that the device characteristics become excellent, and the deterioration is reduced and the manufacturing yield ration is improved.

According to a second aspect of the present disclosure, a silicon carbide single crystal epitaxial wafer includes: a silicon carbide single crystal substrate having an offset direction of a [11-20]-orientation direction; and an epitaxial film disposed on the silicon carbide single crystal substrate. The epitaxial film includes a threading dislocation with a dislocation line, which penetrates a (0001)-plane c-face. An angle between the direction of the dislocation line of the threading dislocation and a [0001]-orientation c-axis is in a range between minus three degrees and plus twenty degrees. A positive sense of the angle is defined by a direction from the c-axis to a normal direction of a substrate surface, and the normal direction is arranged between the [11-20]-orientation direction and the c-axis. The threading dislocation is disposed on a (1-100)-face.

When the electric device is formed in such a SiC single crystal epitaxial wafer, the device characteristics are excellent. Thus, the deterioration is prevented, and the manufacturing yield ratio is improved. Further, the threading dislocation is on the (1-100)-face, and the dislocation line is aligned to tilt on the same orientation surface. Thus, the deterioration of the device characteristics and the reduction of the manufacturing yield ration are restricted.

According to a third aspect of the present disclosure, a silicon carbide single crystal epitaxial wafer includes: a silicon carbide single crystal substrate having an offset direction of a [1-100]-orientation direction; and an epitaxial film disposed on the silicon carbide single crystal substrate. The epitaxial film includes a threading dislocation with a dislocation line, which penetrates a (0001)-plane c-face. An angle between the direction of the dislocation line of the threading dislocation and a [0001]-orientation c-axis is in a range between minus three degrees and plus 22.5 degrees. A positive sense of the angle is defined by a direction from the c-axis to a normal direction of a substrate surface, and the normal direction is arranged between the [1-100]-orientation direction and the c-axis. The threading dislocation is disposed on a (11-20)-face.

When the electric device is formed in such a SiC single crystal epitaxial wafer, the device characteristics are excellent, the deterioration is restricted, and the manufacturing yield ratio is improved. Further, the threading dislocation is disposed on the (11-20)-face, and the dislocation line is aligned to tilt on the same orientation surface. Thus, the deterioration and the manufacturing yield ratio are restricted.

According to a fourth aspect of the present disclosure, a silicon carbide semiconductor device includes: an electric device disposed in the silicon carbide single crystal substrate or the silicon carbide single crystal epitaxial wafer. The device characteristics become much excellent.

According to a fifth aspect of the present disclosure, a silicon carbide semiconductor device includes: a field effect transistor as an electric device having a channel surface of a (1-100)-face disposed in the silicon carbide single crystal epitaxial wafer. The device characteristics become much excellent.

According to a sixth aspect of the present disclosure, a silicon carbide semiconductor device includes: a field effect transistor as an electric device having a channel surface of a (11-20)-face disposed in the silicon carbide single crystal epitaxial wafer. The device characteristics become much excellent.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

To achieve an object of the invention, the present inventors have made experiments regarding a relationship between a direction of a dislocation line in a threading dislocation and deterioration of device characteristics or a manufacturing yield ratio. As a result, the present inventors have discovered that the deterioration of device characteristics and the reduction of the manufacturing yield ratio are restricted when the direction of the dislocation line in each threading dislocation is aligned. Specifically, when an angle between the direction of the dislocation line in the threading dislocation with the dislocation line penetrating the (0001)-plane face (i.e., C-face) and the [0001]-axis is set to be equal to or smaller than 22.5 degrees, the deterioration of device characteristics and reduction of manufacturing yield ratio are prevented. (Here, the threading dislocation with the dislocation line penetrating the (0001)-plane face (i.e., C-face) is defined as merely a threading dislocation)

Further, the present inventors have preliminary studied and made various experiments regarding a growth direction of SiC single crystal and a growth direction of a crystal defect. As a result, when crystal is grown from an offset substrate having a C-face by a conventional sublimation method, the threading dislocation is grown with various growth directions tilted from the growth direction of the SiC single crystal. When crystal is growth from an offset substrate having a C-face by a CVD method as an epitaxial growth method, the growth direction of the threading defect took over is limited to be on the (11-2n)-orientation face or a (1-10n)-orientation face. When an epitaxial film is grown on a SiC single crystal substrate, a step flow direction relates to the threading defect. Specifically, the tilting direction of the dislocation line is aligned to be the same as the step flow direction. Thus, the angle of the dislocation line is limited to be a specific direction.

The growth direction of the threading dislocation relates closely to an impurity concentration in an epitaxial growth process. Here, "n" represents an integer. For example, the (11-1n)-orientation face includes a (11-21)-orientation face, a (11-22)-orientation face, a (11-23)-orientation face, a (11-22)-orientation face. The (1-10n)-orientation face includes a (1-101)-orientation face, a (1-102)-orientation face, and a (1-103)-orientation face.

Figure 5:
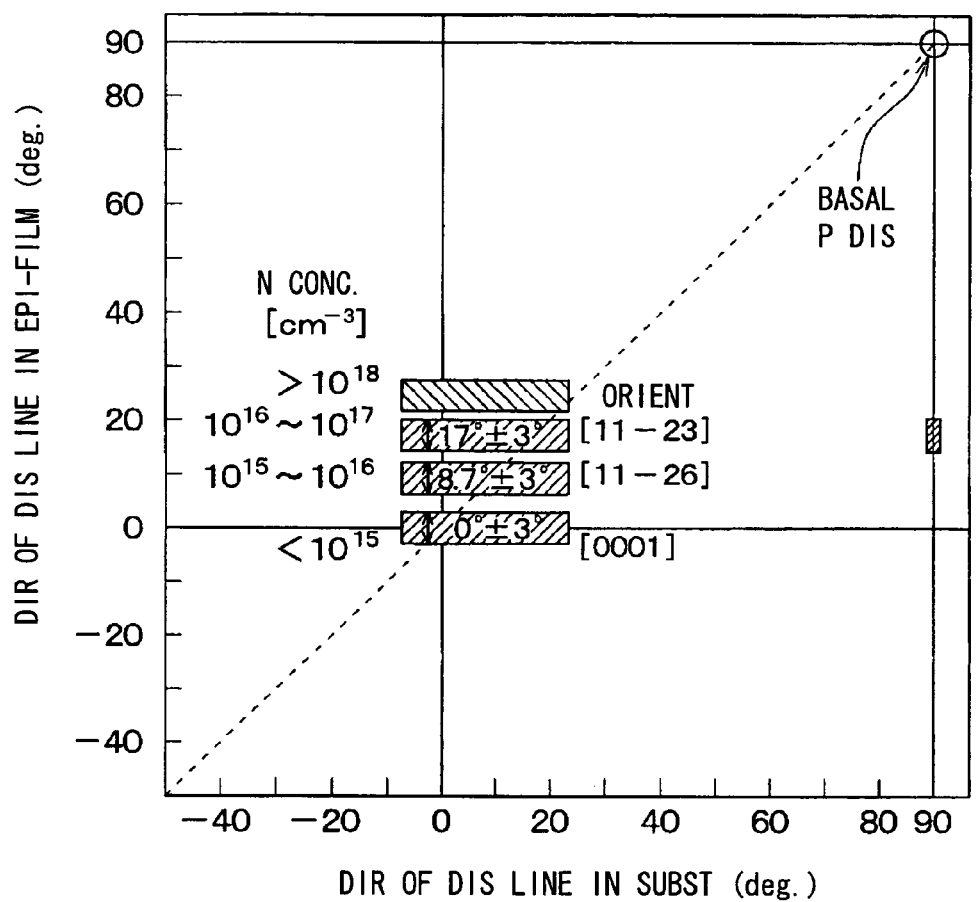
FIG. 5 is a graph showing a direction of a dislocation line of a threading dislocation took over into an epitaxial film in each impurity concentration.

FIG. 5 is a graph showing a relationship between a direction of a dislocation line of a threading dislocation formed in a SiC single crystal substrate and a direction of a dislocation line of a threading dislocation took over into an epitaxial film in respective impurity concentration when the epitaxial film is formed on the SiC single crystal substrate, which is made of 4H—SiC and having an offset direction of [11-20]-orientation direction and an offset angle of four degrees. Here, the direction of the dislocation line of the threading dislocation in the SiC single crystal substrate and the epitaxial film is defined such that a side tilting on the same side as the normal direction of the substrate with respect to the [0001]-orientation c-axis is defined as plus angle. That is the [0001]-orientation c-axis defines zero degree, and the normal direction of the substrate defines positive. Here, each characteristic is shown in respective nitrogen concentration when the impurity is nitrogen. The nitrogen concentration is merely an example, and similar characteristics are obtained even when the impurity is different.

As shown in FIG. 5, when the nitrogen concentration is, for example, equal to or smaller than $1 \times 10^{15}$ $cm^{-3}$, the direction of the dislocation line of the threading dislocation in the epitaxial film is in a range of plus three degrees and minus three degrees around zero degree as a center, i.e., the direction is almost the same direction of the [0001]-orientation direction. Further, when the nitrogen concentration is, for example, equal to or larger than $1 \times 10^{15}$ $cm^{-3}$ and equal to or smaller than $1 \times 10^{16}$ $cm^{-3}$, the direction of the dislocation line of the threading dislocation in the epitaxial film is in a range of plus three degrees and minus three degrees around 8.7 degree as a center, i.e., the direction is almost the same direction of the [11-26]-orientation direction. Further, when the nitrogen concentration is, for example, equal to or larger than $1 \times 10^{16}$ $cm^{-3}$ and equal to or smaller than $1 \times 10^{17}$ $cm^{-3}$, the direction of the dislocation line of the threading dislocation in the epitaxial film is in a range of plus three degrees and minus three degrees around 17 degree as a center, i.e., the direction is almost the same direction of the [11-23]-orientation direction. When the nitrogen concentration is equal to or larger than $1 \times 10^{18}$ $cm^{-3}$, the direction of the dislocation line of the threading dislocation in the epitaxial film is larger than 22.5 degrees. (Please refer to Japanese Application Publication No. 2009-29584)

Figure 6:
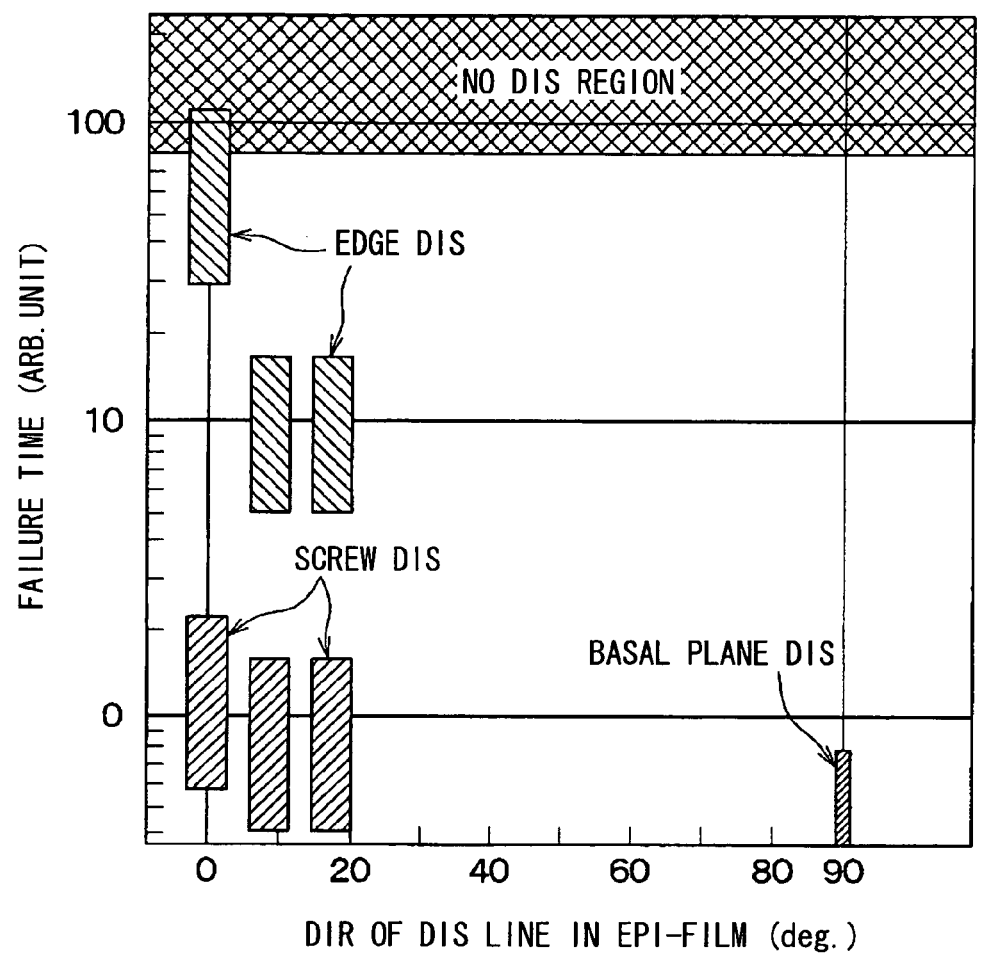
FIG. 6 is a graph showing a relationship between a failure time of an electric power device and a direction of a threading dislocation.

Thus, by using the SiC single crystal substrate, in which the direction of the dislocation is specified, a relationship between the direction of the dislocation line of the threading dislocation formed in the SiC single crystal substrate and a failure time (time elapsing to breakdown) of an electronic device as an electronic power device such as a diode and a MOS transistor formed in the SiC single crystal substrate is examined. FIG. 6 is a graph showing the relationship. Here, the direction of the dislocation line in the threading dislocation is measured by observation of a transmission electron microscope.

As shown in FIG. 6, even when the threading dislocation is formed, the angle of the threading dislocation is equal to or smaller than 20 degrees (that is 17 degrees plus 3 degrees, i.e., =17°+3°), the failure time of the electric device is sufficiently long. The effect of longer operating time in a case where the edge dislocation is aligned is higher than that in a case where the screw dislocation is aligned.

As described in the patent document No. 1 or the like, the basal plane dislocation provides to reduce the device characteristics and manufacturing yield ratio. This is because the basal plane dislocation is arranged on the (0001)-plane c-face, and the dislocation provides an extended dislocation so that the dislocation functions as a generation core of a stacking fault, and thereby, the stacking fault deteriorates the device characteristics. On the other hand, since the threading dislocation having the dislocation line along with the [0001]-orientation c-axis direction is perpendicular to the direction of the dislocation line of the basal plane dislocation, the dislocation does not provide the extended dislocation on the c-face, and therefore, the dislocation does not generate the stacking fault. Accordingly, when the electric device is formed in the SiC single crystal substrate having the direction of the dislocation line of the threading dislocation, which is the [0001]-orientation c-axis, the device characteristics are excellent, and deterioration of the device is small. Further, the manufacturing yield ratio is improved. Furthermore, since the direction of the dislocation line of the threading dislocation is aligned, the variation of characteristics with respect to a position is reduced, so that the manufacturing yield ratio is improved.

When the direction of the dislocation line of the threading dislocation deviates from the [0001]-orientation c-axis, a deviation angle is defined as θ. A component along with the direction on the basal plane arises, and the component is in proportion to sin θ. This component provides the extended dislocation, and the component becomes a source of the stacking fault, which deteriorates the device characteristics. However, the present inventors have confirmed that the influence of the component is small when the angle θ is small.

Thus, when the SiC single crystal substrate having the offset angle of the [11-20]-orientation direction shown in FIG. 5 is used, the present inventors have confirmed that the deterioration of the device characteristics and the reduction of the manufacturing yield ratio are restricted by aligning the direction of the dislocation line of the threading dislocation within 20 degrees. The SiC single crystal substrate having the offset angle with the offset direction of the [1-100]-orientation direction is used for a similar experiment. The present inventors have confirmed that, when the direction of the dislocation line of the threading dislocation is aligned within 22.5 degrees (that is 19.5 degrees plus 3 degrees, i.e., =19.5°+3°), i.e., when the direction is aligned in a range between plus three degrees and minus three degrees with respect to 19.5 degrees, which corresponds to the [2-203]-orientation direction, the same effect is obtained as a case where the SiC single crystal substrate having the offset angle with the offset direction of the [11-20]-orientation direction is used Accordingly, as described above, the deterioration of the device characteristics is reduced by aligning the angle θ between the direction of the dislocation line of the threading dislocation, i.e., the direction of the dislocation line and the [0001]-axis to be equal to or smaller than 22.5 degrees (that is 19.5 degrees plus 3 degrees, i.e., =19.5°+3°). Specifically, when the angle θ is 17 degrees (i.e., in case of the [11-23]-orientation direction), or when the angle θ is 19.5 degrees (i.e., in case of the [2-203]-orientation direction), it is easy to control the angle based on the impurity concentration when the epitaxial film is grown. Thus, it is easy to form the SiC single crystal substrate having the direction of the threading dislocation aligned to be the above angle θ.

Further, the dislocation line is preferably tilted with respect to the [0001]-orientation c-axis, and further arranged on a plane defined by the [0001]-orientation c-axis and a specific direction perpendicular to the c-axis (e.g., the [11-20]-orientation direction or the [1-100]-orientation direction).

For example, when a SiC single crystal substrate having an offset angle with an offset direction of the [11-20]-orientation direction is used, the dislocation line tilts with respect to the [0001]-orientation c-axis so as to arrange the dislocation line on the (1-100)-orientation face. Thus, since the dislocation line is aligned to tilt only on the same plane, it is possible to restrict deterioration of the device characteristics and reduction of the manufacturing yield ratio. For example, when a filed effect transistor having a channel surface on the (1-100)-orientation face is formed in the SiC single crystal substrate, the dislocation line does not intersect with the channel surface. Thus, the characteristics and reliability of the transistor are much improved.

When the SiC single crystal substrate having the offset angle with the offset direction of the [1-100]-orientation direction is used, similar effects are obtained. In this case, the dislocation line tilts with respect to the [0001]-orientation c-axis so as to arrange the dislocation line on the (11-20)-orientation face. Accordingly, for example, when the field effect transistor having the channel surface of the (11-20)-orientation face is formed in the SiC single crystal substrate, the dislocation line does not intersect with the channel surface. Thus, the characteristics and reliability of the transistor are much improved.

A substrate, in which an electric device is formed, is a SiC single crystal substrate or a SiC single crystal epitaxial wafer having an epitaxial film grown on a SiC single crystal substrate. The SiC single crystal substrate having the aligned threading dislocation is formed in such a manner that an epitaxial film having an aligned threading dislocation is grown, a bulk crystal is grown on the epitaxial film, and then, the bulk crystal is cut at a predetermined orientation surface. When this SiC single crystal substrate is used, since the direction of the dislocation line of the threading dislocation formed in the SiC single crystal substrate itself has directly influence to the device characteristics, it is necessary for the direction of the dislocation line of the threading dislocation formed in the SiC single crystal substrate itself to satisfy the above relationship. However, in case of the SiC single crystal epitaxial wafer, the direction of the dislocation line of the threading dislocation formed in the epitaxial film influences the device characteristics. Accordingly, when at least the direction of the dislocation line of the threading dislocation formed in the epitaxial film is aligned, the device characteristics are excellent even of the direction of the dislocation line of the threading dislocation formed in the SiC single crystal substrate as a base is not aligned.

First Embodiment

Figure 1A:
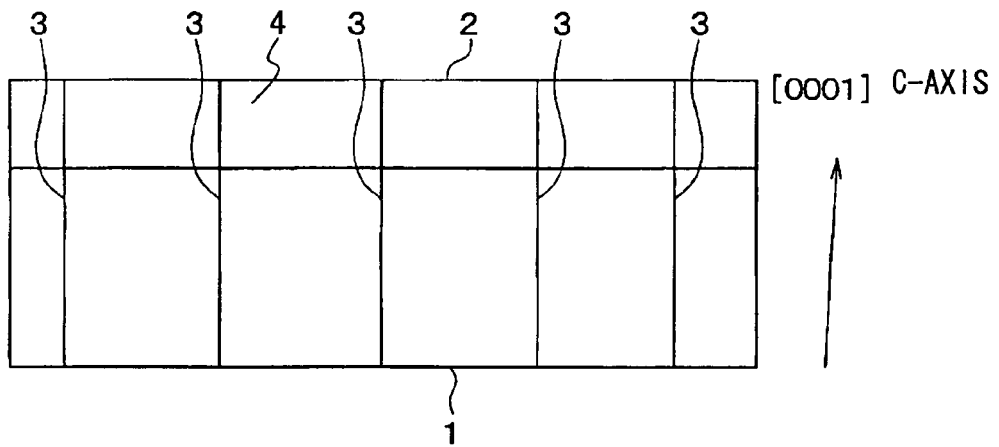
FIG. 1A is a cross sectional view showing a SiC single crystal epitaxial wafer according to a first embodiment of the present invention.
Figure 1B:
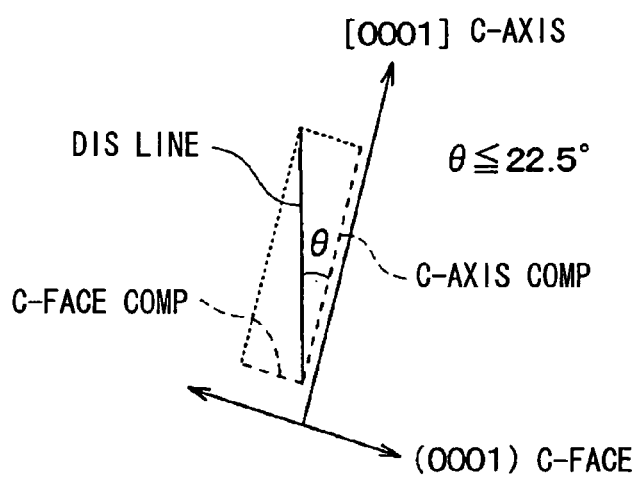
FIG. 1B is a vector diagram showing a relationship of an angle between a dislocation line of a threading dislocation in the SiC single crystal epitaxial wafer and a c-axis.

A first embodiment of the present invention will be explained. FIG. 1A is a cross sectional view of a SiC single crystal epitaxial wafer according to the present embodiment, and FIG. 1B is a vector diagram showing a relationship of an angle between a dislocation line of a threading dislocation in the SiC single crystal epitaxial wafer and a c-axis.

As shown in FIG. 1A, the SiC single crystal epitaxial wafer is formed such that an epitaxial film 2 is grown on a SiC single crystal substrate 1 made of 4H—SiC. A threading dislocation 3 is disposed in both of the SiC single crystal substrate 1 and the epitaxial film 2. At least the threading dislocation 3 formed in the epitaxial film 2 has an angle θ between a direction of a dislocation line and a [0001]-orientation c-axis equal to or smaller than 22.5 degrees (that is 19.5 degrees plus 3 degrees, i.e., =19.5°+3°). Here, the direction of the dislocation line of the threading dislocation 3 in the SiC single crystal substrate 1 and the epitaxial film 2 is defined such that a tilting direction toward a normal direction of a wafer surface represents a positive angle.

In the present embodiment, the direction of the dislocation line of the threading dislocation 3 is aligned so that the angle θ between the direction of the dislocation line of the threading dislocation 3 and the [0001]-orientation c-axis is equal to or smaller than 22.5 degrees. Since the threading dislocation 3 having the dislocation line along with the [0001]-orientation c-axis is perpendicular to the direction of the dislocation line of the basal plane dislocation, the dislocation 3 does not provide the extended dislocation on the c-face, so that the stacking fault is not generated. Accordingly, when the electric device 4 is formed in the SiC single crystal substrate having the direction of the dislocation line of the threading dislocation 3 as the [0001]-orientation c-axis, the SiC semiconductor device is formed such that the device characteristics becomes excellent, the deterioration does not occur, and the manufacturing yield ratio is improved.

Second Embodiment

A second embodiment of the present invention will be explained. The present embodiment provides to align the direction of the dislocation line of the threading dislocation 3 to be restricted and more specifically, compared with the first embodiment. Here, the structure of the SiC single crystal epitaxial wafer according to the present embodiment is similar to that of the first embodiment. Thus, difference between the present and first embodiments will be explained.

In the SiC single crystal epitaxial wafer shown in FIG. 1A according to the present embodiment, all of the threading dislocations 3 disposed in the epitaxial film 2 are aligned such that the angle θ between the direction of the dislocation line and the [0001]-orientation c-axis is in a range between minus three degrees and plus three degrees with respect to a specific angle. For example, the specific angle is 19.5 degrees (i.e., the [2-203]-orientation direction) or 17 degrees (i.e., the [11-23]-orientation direction).

Thus, the direction of the dislocation line of the threading dislocation 3 is aligned to the specific direction. Accordingly, in addition to the similar effect according to the first embodiment, the deviation of the characteristics with respect to the position is reduced so that the manufacturing yield ratio is much improved since the direction of the dislocation line of the threading dislocation 3 is aligned.

Third Embodiment

A third embodiment of the present invention will be explained. The present embodiment provides to align the direction of the dislocation line of the threading dislocation 3 to be restricted and more specifically to the direction of the c-axis as a center, compared with the first embodiment. Here, the structure of the SiC single crystal epitaxial wafer according to the present embodiment is similar to that of the first embodiment. Thus, difference between the present and first embodiments will be explained.

In the SiC single crystal epitaxial wafer shown in FIG. 1A according to the present embodiment, all of the threading dislocations 3 disposed in the epitaxial film 2 are aligned such that the direction of the dislocation line is in a range between minus three degrees and plus three degrees with respect to the [0001]-orientation c-axis.

Thus, the direction of the dislocation line of the threading dislocation 3 is aligned to the [0001]-orientation c-axis as a center. Accordingly, in addition to the similar effect according to the first embodiment, the c-face component becomes small, and the deterioration of the device characteristics is much reduced.

Fourth Embodiment

A fourth embodiment of the present invention will be explained. The present embodiment provides to align the direction of the dislocation line of the threading dislocation 3 more specifically than the first to third embodiments. Here, the structure of the SiC single crystal epitaxial wafer according to the present embodiment is similar to that of the first embodiment. Thus, difference between the present and first embodiments will be explained.

Figure 2A:
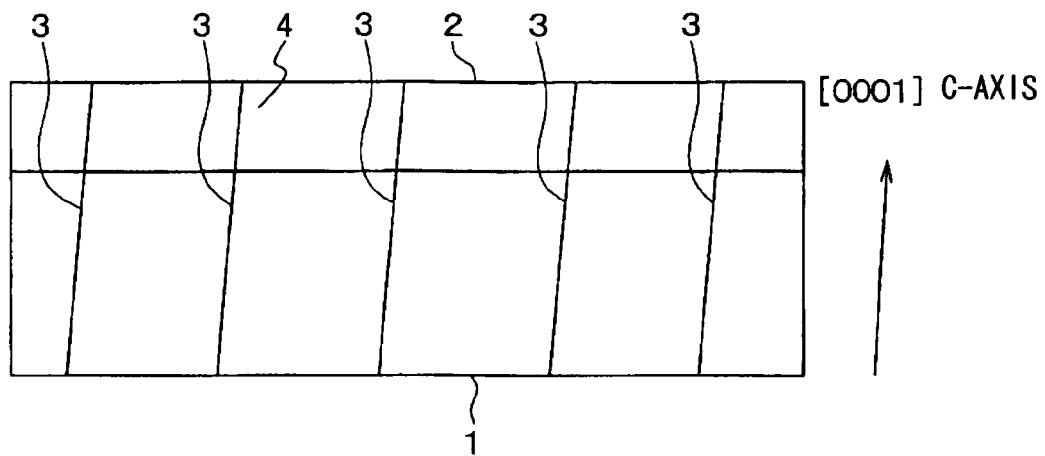
FIG. 2A is a cross sectional view showing a SiC single crystal epitaxial wafer according to a fourth embodiment of the present invention.
Figure 2B:
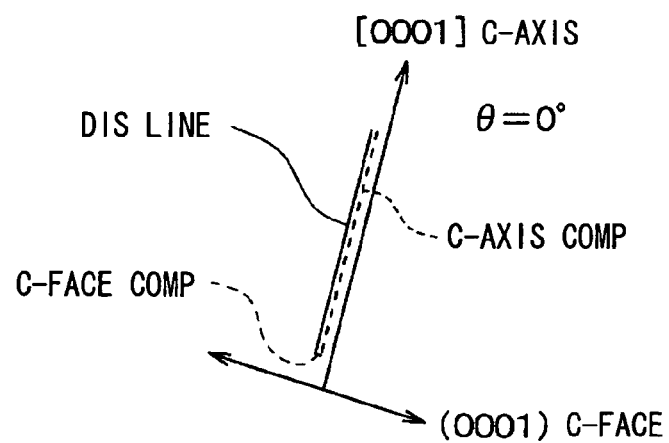
FIG. 2B is a vector diagram showing a relationship of an angle between a dislocation line of a threading dislocation in the SiC single crystal epitaxial wafer and a c-axis.

FIG. 2A is a cross sectional view of the SiC single crystal epitaxial wafer according to the present embodiment. FIG. 2B is a vector diagram showing a relationship of the angle between the dislocation line of the threading dislocation in the SiC single crystal epitaxial wafer and the c-axis.

As shown in FIGS. 2A and 2B, the present embodiment provides to align the direction of the dislocation line of all of the threading dislocations 3 disposed in the epitaxial film 2 to be parallel to the [0001]-orientation c-axis, compared with the SiC single crystal epitaxial wafer shown in FIGS. 1A and 1B.

Thus, the direction of the dislocation line of the threading dislocation 3 is aligned to the [0001]-orientation c-axis. Accordingly, in addition to the similar effect according to the first embodiment, the c-face component becomes zero, and the deterioration of the device characteristics is much reduced.

Fifth Embodiment

A fifth embodiment of the present invention will be explained. The present embodiment provides to specify the offset direction of the SiC single crystal epitaxial wafer used in the first embodiment. Here, the structure of the SiC single crystal epitaxial wafer according to the present embodiment is similar to that of the first embodiment. Thus, difference between the present and first embodiments will be explained.

Figure 3A:
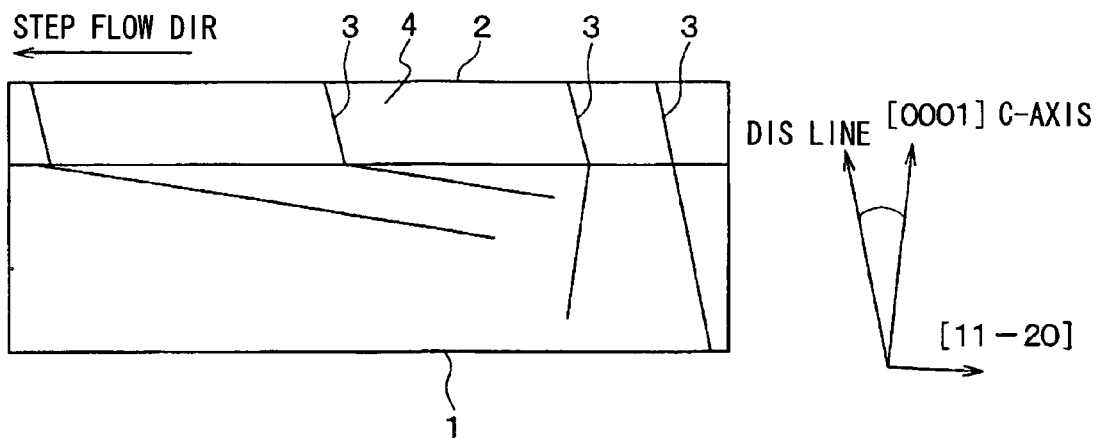
FIG. 3A is a cross sectional view showing a SiC single crystal epitaxial wafer according to a fifth embodiment of the present invention.
Figure 3B:
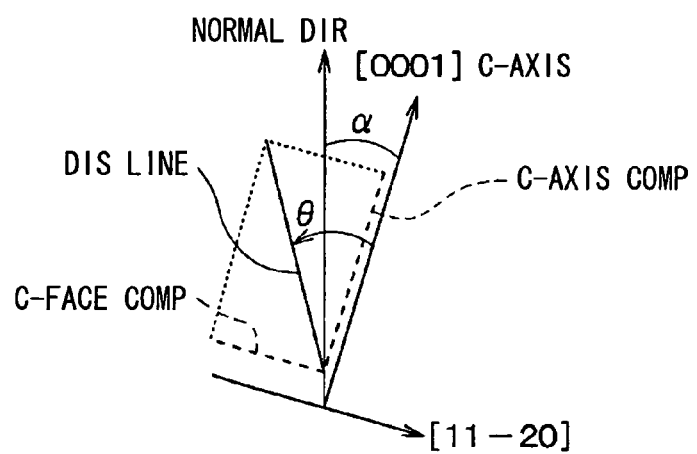
FIG. 3B is a vector diagram to explain an offset angle and a tilt angle of a threading dislocation.

FIG. 3A is a cross sectional view of the SiC single crystal epitaxial wafer according to the present embodiment. FIG. 3B is a vector diagram for explaining the offset angle and the tilt angle of the threading dislocation. Here, an angle α is defined as an angle between the [0001]-orientation c-axis and the normal direction of a wafer surface. An angle θ is defined as an angle between the [0001]-orientation c-axis and the dislocation line. The normal direction defines a plus angle when extending toward the same side as the normal direction of the wafer surface.

As shown in FIG. 3A, in the present embodiment, the SiC single crystal epitaxial wafer having the offset angle α with the offset direction of the [11-20]-orientation direction. The SiC single crystal substrate 1 has an impurity concentration of, for example, $5 \times 10^{18}$ cm$^{-3}$, which is high concentration. The epitaxial film 2 has a low concentration equal to or lower than $1 \times 10^{17}$ cm$^{-3}$. The direction of the dislocation line of the threading dislocation 3 disposed in the epitaxial film 2 in the SiC single crystal epitaxial wafer is tilted and aligned to the same direction as the offset direction. Thus, the angle θ between the direction of the dislocation line of the threading dislocation 3 and the [0001]-orientation c-axis is equal to or larger than minus three degrees (that is zero degree minus three degrees, i.e., =0°−3°) and equal to or smaller than 20 degrees (that is 17 degrees plus three degrees, i.e., =17°+3°). The dislocation line tilts with respect to the [0001]-orientation c-axis on the (1-100)-face, through which the [0001]-orientation c-axis and a specific direction (for example, the [11-20]-orientation direction) perpendicular to the [0001]-orientation c-axis pass.

Here, as shown in FIG. 3B, when the offset direction is the [11-20]-orientation direction, the offset angle α means that the angle of the normal direction of the wafer surface with respect to the [0001]-orientation c-axis is α degrees. Further, the angle θ is defined in the dislocation line of the threading dislocation 3 such that the normal line side is defined as plus when the dislocation line extends to the same direction as the normal direction of the wafer surface with respect to the [0001]-orientation c-axis.

In the present embodiment, the direction of the dislocation line of the threading dislocation formed in the epitaxial film 2 is set to be the above angle. However, the threading dislocation 3 formed in the SiC single crystal substrate 1 is not specified, so that the dislocation 3 may have any direction.

Thus, in the present embodiment, the direction of the dislocation line of the threading dislocation 3 is aligned so that the angle θ between the direction of the dislocation line of the threading dislocation 3 and the [0001]-orientation c-axis is equal to or larger than minus three degrees and equal to or smaller than 20 degrees. When the electric device 4 is formed in the above SiC single crystal epitaxial wafer, similar to the first embodiment, the device characteristics are excellent, and deterioration of the device is small. Further, the manufacturing yield ratio is improved. Further, in the present embodiment, only the direction of the dislocation line of the threading dislocation 3 formed in the epitaxial film 2 is specified. Since the electric device 4 is formed in the epitaxial film 2, not in the SiC single crystal substrate 1 when the electric device 4 is formed in the SiC single crystal epitaxial wafer, it is sufficient to specify the direction of the dislocation line of the threading dislocation 3 in the epitaxial film 2.

The SiC single crystal epitaxial wafer having the above structure is manufactured as follows, for example. First, the bulky SiC single crystal is prepared. A surface of the SiC single crystal including the [11-20]-orientation direction is cut, so that the SiC single crystal substrate 1 having the above offset direction is prepared. Then, the epitaxial film 2 made of SiC single crystal is grown on the surface of the SiC single crystal substrate by a CVD method.

Thus, as shown in FIG. 5, the threading dislocation 3 disposed in the SiC substrate 1 provides the dislocation in the epitaxial film 2 having the angle θ with respect to the [0001]-orientation c-axis equal to or larger than minus three degrees and equal to or smaller than 20 degrees. This may relate to the direction of the step flow when the epitaxial film 2 is grown. It is confirmed that the tilt direction of the dislocation line of the threading dislocation 3 and the step flow direction are the same.

For example, the impurity in the epitaxial film 2 is nitrogen, and the impurity concentration is in a range between $1 \times 10^{16}$ cm$^{-3}$ and $1 \times 10^{17}$ cm$^{-3}$. In this case, the direction of the dislocation line of the threading dislocation 3 is, for example, in parallel to the [11-23]-orientation direction or in a range between minus three degrees and plus three degrees with respect to the [11-23]-orientation direction. Thus, the angle θ is in a range between 17 degrees minus three degrees and 17 degrees plus three degrees (i.e., 17°±3°). Further, when the impurity in the epitaxial film 2 is, for example, nitrogen, and the impurity concentration is, for example, in a range between $1 \times 10^{15}$ cm$^{-3}$ and $1 \times 10^{16}$ cm$^{-3}$, the direction of the dislocation line of the threading dislocation 3 is, for example, in parallel to the [11-26]-orientation direction or in a range between minus three degrees and plus three degrees with respect to the [11-26]-orientation direction. Thus, the angle θ is in a range between 8.7 degrees minus three degrees and 8.7 degrees plus three degrees (i.e., 8.7°±3°). Furthermore, when the impurity in the epitaxial film 2 is, for example, nitrogen, and the impurity concentration is, for example, equal to or smaller than $1 \times 10^{15}$ cm$^{-3}$, the direction of the dislocation line of the threading dislocation 3 is, for example, in parallel to the [0001]-orientation direction or in a range between minus three degrees and plus three degrees with respect to the [0001]-orientation direction. Thus, the angle α is in a range between 0 degree minus three degrees and 0 degree plus three degrees (i.e., 0°±3°).

Thus, the impurity concentration is set to be equal to or smaller than $1 \times 10^{17}$ cm$^{-3}$, so that the direction of the dislocation line of the threading dislocation 3 is aligned to the same direction. Since the above impurity concentration is suitable for manufacturing the device. Thus, the device characteristics are excellent without deterioration, and the manufacturing yield ratio is improved. On the other hand, when the impurity concentration is, for example, $1 \times 10^{18}$ cm$^{-3}$, the angle θ becomes larger than 20 degrees, and a component along with a direction on the basal plane becomes large. Thus, the device characteristics are adversely affected. Further, since the impurity concentration is high, the concentration is not suitable for manufacturing the device. Thus, the wafer is not suitably used. Here, although the impurity is the nitrogen providing the N conductive type, other impurity may be used. Alternatively, aluminum or boron providing the P conductive type may be used.

Further, in the present embodiment, the dislocation line tilts with respect to the [0001]-orientation c-axis only on the (1-100)-face, through which the [0001]-orientation c-axis and the specific direction (for example, the [11-20]-orientation direction) perpendicular to the [0001]-orientation c-axis pass.

Thus, since the dislocation line is aligned to tilt on the same surface, it is possible to restrict the deterioration of the device characteristics and reduction of the manufacturing yield ratio. For example, when the field effect transistor having the channel surface of the (1-100)-face is formed in the SiC single crystal substrate, the dislocation line does not intersect with the channel surface. Accordingly, it is possible to improve the characteristics and reliability of the transistor.

Here, the offset direction is the [11-20]-orientation direction and the offset angle is α degrees. As long as the α degrees are larger than zero, and the offset angle provides the step flow growth of the epitaxial film 2, the wafer may, have any offset angle. For example, the offset angle may be four degrees.

Sixth Embodiment

A sixth embodiment of the present invention will be explained. The present embodiment provides to specify and align the direction of the dislocation line of the threading dislocation 3 to be limited, compared with the fifth embodiment. Here, the structure of the SiC single crystal epitaxial wafer according to the present embodiment is similar to that of the fifth embodiment. Thus, difference between the present and fifth embodiments will be explained.

In the present embodiment, in the SiC single crystal epitaxial wafer having the offset angle α with the offset direction shown in FIG. 3A of the [11-20]-orientation direction, the angle θ between the direction of the dislocation line and the [0001]-orientation c-axis regarding all threading dislocations disposed in the epitaxial film 2 is in a range between minus three degrees and plus three degrees with respect to 17 degrees (i.e., the [11-23]-orientation direction).

Thus, the direction of the dislocation line of the threading dislocation 3 is aligned to the specific direction. Accordingly, in addition to the same effect according to the fifth embodiment, since the direction of the dislocation line of the threading dislocation 3 is aligned, the deviation of the characteristics with respect to the position is reduced, and the manufacturing yield ratio is improved.

The above structure can be realized such that the epitaxial film 2 is grown on the SiC single crystal substrate 1 having the impurity concentration in a range between $1 \times 10^{16}$ cm$^{-3}$ and $1 \times 10^{17}$ cm$^{-3}$.

Seventh Embodiment

A seventh embodiment of the present invention will be explained. The present embodiment provides to specify and align the direction of the dislocation line of the threading dislocation 3 to be limited and definitive, compared with the fifth embodiment. Here, the structure of the SiC single crystal epitaxial wafer according to the present embodiment is similar to that of the fifth embodiment. Thus, difference between the present and fifth embodiments will be explained.

In the present embodiment, in the SiC single crystal epitaxial wafer having the offset angle α with the offset direction shown in FIG. 3A of the [11-20]-orientation direction, the angle θ between the direction of the dislocation line and the [0001]-orientation c-axis regarding all threading dislocations disposed in the epitaxial film 2 is in a range between minus three degrees and plus three degrees with respect to 8.7 degrees (i.e., the [11-26]-orientation direction).

Thus, the direction of the dislocation line of the threading dislocation 3 is aligned to the specific direction. Accordingly, in addition to the same effect according to the fifth embodiment, since the direction of the dislocation line of the threading dislocation 3 is aligned, the deviation of the characteristics with respect to the position is reduced, and the manufacturing yield ratio is improved.

The above structure can be realized such that the epitaxial film 2 is grown on the SiC single crystal substrate 1 having the impurity concentration in a range between $1 \times 10^{15}$ cm$^{-3}$ and $1 \times 10^{16}$ cm$^{-3}$.

Eighth Embodiment

An eighth embodiment of the present invention will be explained. The present embodiment provides to specify the offset direction of the SiC single crystal substrate according to the first embodiment to a different direction from the fifth embodiment. Here, the structure of the SiC single crystal epitaxial wafer according to the present embodiment is similar to that of the first embodiment. Thus, difference between the present and first embodiments will be explained.

Figure 4A:
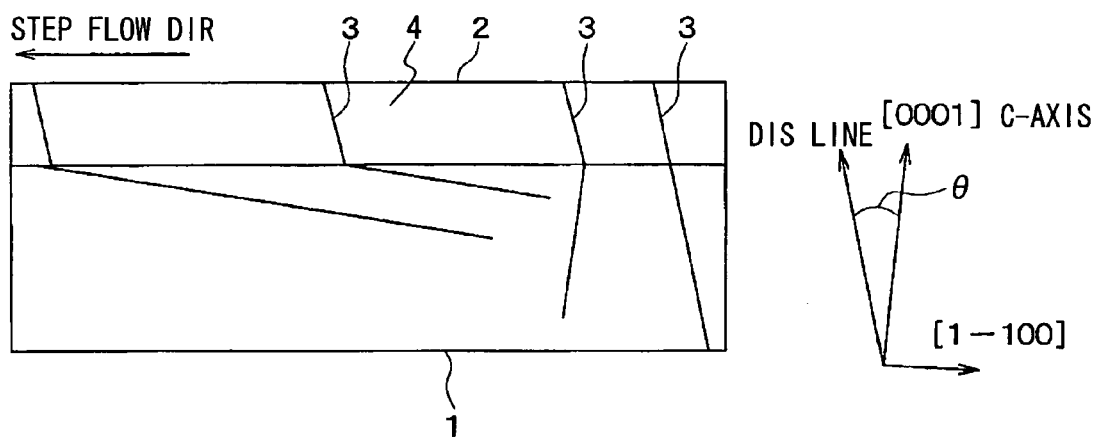
FIG. 4A is a cross sectional view showing a SiC single crystal epitaxial wafer according to an eighth embodiment of the present invention.
Figure 4B:
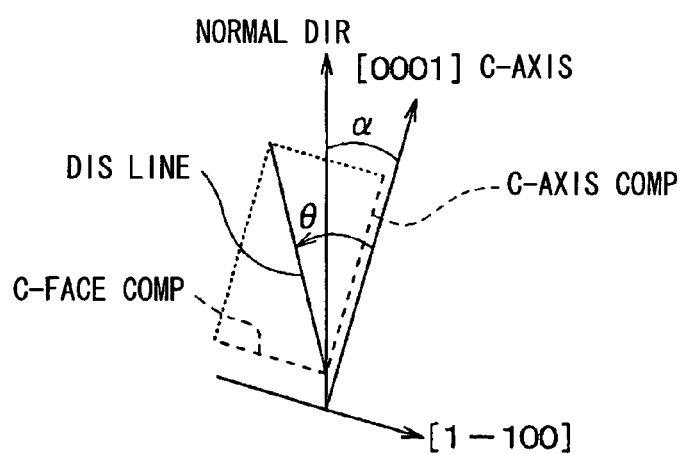
FIG. 4B is a vector diagram to explain an offset angle and a tilt angle of a threading dislocation.

FIG. 4A is a cross sectional view of the SiC single crystal epitaxial wafer according to the present embodiment. FIG. 4B is a vector diagram explaining the offset angle and the tilt angle of the threading dislocation.

As shown in FIG. 4A, in the present embodiment, the SiC single crystal epitaxial wafer having the offset angle α with the offset direction of the [1-100]-orientation direction is used. The SiC single crystal substrate 1 has an impurity concentration of $5 \times 10^{18}$ cm$^{-3}$, which is high. The epitaxial film 2 has a low impurity concentration equal to or smaller than $1 \times 10^{17}$ cm$^{-3}$. The direction of the dislocation line of the threading dislocation 3 disposed in the epitaxial film 2 of the SiC single crystal epitaxial wafer is tilted and aligned to the same direction as the offset direction. Thus, the angle θ between the direction of the dislocation line of the threading dislocation 3 and the [0001]-orientation c-axis is equal to or larger than minus three degrees (that is zero minus three degrees, i.e., =0°−3°) and equal to or smaller than 22.5 degrees (that is 19.5 degrees plus three degrees, i.e., =19.5°+3°). Further, the dislocation line tilts with respect to the [0001]-orientation c-axis only on the (11-20)-face, through which the [0001]-orientation c-axis and a specific direction (for example, the [1-100]-orientation direction) perpendicular to the [0001]-orientation c-axis pass.

Here, as shown in FIG. 4B, when the offset direction is the [1-100]-orientation direction, the offset angle α means that the normal direction of the wafer surface has an angle α with respect to the [0001]-orientation c-axis. Further, the angle θ of the dislocation line of the threading dislocation 3 is defined such that the normal line side is defined as plus when the dislocation line extends to the same direction as the normal direction of the wafer surface with respect to the [0001]-orientation c-axis.

In the present embodiment, the direction of the dislocation line of the threading dislocation 3 formed in the epitaxial film 2 is specified to the above angle. However, the threading dislocation 3 formed in the SiC single crystal substrate 1 is not specified, so that the direction of the dislocation line may be any angle.

Thus, in the present embodiment, the direction of the dislocation line of the threading dislocation 3 is aligned, and the angle θ between the direction of the dislocation line and the [0001]-orientation c-axis is equal to or larger than minus three degrees and equal to or smaller than 22.5 degrees. When the electric device 4 is formed in the SiC single crystal epitaxial wafer, the similar effect to the fifth embodiment is obtained.

The SiC single crystal epitaxial wafer having the above structure is manufactured as follows, for example. First, the bulky SiC single crystal is prepared. A surface of the SiC single crystal including the [1-100]-orientation direction is cut, so that the SiC single crystal substrate 1 having the above offset direction is prepared. Then, the epitaxial film 2 made of SiC single crystal is grown on the surface of the SiC single crystal substrate by a CVD method.

Thus, the threading dislocation 3 disposed in the SiC substrate 1 provides the dislocation in the epitaxial film 2 having the angle θ with respect to the [0001]-orientation c-axis, which is equal to or larger than minus three degrees and equal to or smaller than 22.5 degrees. This may relate to the direction of the step flow when the epitaxial film 2 is grown. It is confirmed that the tilt direction of the dislocation line of the threading dislocation 3 and the step flow direction are the same.

For example, the impurity concentration (for example, the nitrogen concentration) in the epitaxial film 2 is controlled to be equal to or smaller than $1\times10^{17}$ cm$^{-3}$, the direction of the dislocation line of the threading dislocation 3 is, for example, in parallel to the [2-203]-orientation direction or in a range between minus three degrees and plus three degrees with respect to the [2-203]-orientation direction. Thus, the angle θ is in a range between 19.5 degrees minus three degrees and 19.5 degrees plus three degrees (i.e., 19.5°±3°). Alternatively, the direction of the dislocation line of the threading dislocation 3 is in parallel to the [1-102]-orientation direction or in a range between minus three degrees and plus three degrees with respect to the [1-102]-orientation direction. Thus, the angle θ is in a range between 15 degrees minus three degrees and 15 degrees plus three degrees (i.e., 15°±3°). Alternatively, the direction of the dislocation line of the threading dislocation 3 is in parallel to the [1-104]-orientation direction or in a range between minus three degrees and plus three degrees with respect to the [1-104]-orientation direction. Thus, the angle θ is in a range between 7.6 degrees minus three degrees and 7.6 degrees plus three degrees (i.e., 7.6°±3°).

Thus, when the impurity concentration is set to be equal to or smaller than $1\times10^{17}$ cm$^{-3}$, the direction of the dislocation line of the threading dislocation 3 is aligned to be the same direction. The above impurity concentration is suitable for manufacturing the device. Thus, the device, characteristics are excellent without deterioration, and the manufacturing yield ratio is improved. On the other hand, when the impurity concentration is, for example, $1\times10^{18}$ cm$^{-3}$, the angle θ becomes larger than 22.5 degrees, and a component along with a direction on the basal plane becomes large. Thus, the device characteristics are adversely affected. Further, since the impurity concentration is high, the concentration is not suitable for manufacturing the device. Thus, the wafer is not suitably used. Here, although the impurity is the nitrogen providing the N conductive type, other impurity may be used. Alternatively, aluminum or boron providing the P conductive type may be used.

Further, in the present embodiment, the dislocation line tilts with respect to the [0001]-orientation c-axis only on the (11-20)-face, through which the [0001]-orientation c-axis and a specific direction (for example, the [1-100]-orientation direction) perpendicular to the [0001]-orientation c-axis pass.

Thus, since the dislocation line is aligned to tilt on the same face, the deterioration of the device characteristics and the reduction of the manufacturing yield ratio are restricted. For example, when the field effect transistor having the channel surface of the (11-20)-face is formed in the SiC single crystal substrate, the dislocation line does not intersect with the channel surface. Accordingly, the characteristics and reliability of the transistor are much improved.

Here, the wafer having the offset angle α with the offset direction of the [1-100]-orientation direction is used. As long as the α degrees are larger than zero, and the offset angle provides the step flow growth of the epitaxial film 2, the wafer may have any offset angle. For example, the offset angle may be four degrees.

Ninth Embodiment

A ninth embodiment of the present invention will be explained. The present embodiment provides to align the direction of the dislocation line of the threading dislocation 3 to be more limited, compared with the eighth embodiment.

Here, the structure of the SiC single crystal epitaxial wafer according to the present embodiment is similar to that of the fifth embodiment. Thus, difference between the present and fifth embodiments will be explained.

In the present embodiment, the angle θ between the direction of the dislocation line and the [0001]-orientation c-axis regarding all of the threading dislocations 3 disposed in the epitaxial film 2 of the SiC single crystal epitaxial wafer having the offset angle α with the offset direction shown in FIG. 4A of the [1-100]-orientation direction is in a range between minus three degrees and plus three degrees with respect to 19.5 degrees (i.e., the [2-203]-orientation direction).

Thus, the direction, of the dislocation line of the threading dislocation 3 is aligned to a specific direction. Accordingly, in addition to the similar effect according to the eighth embodiment, the deviation of the characteristics with respect to the position is reduced so that the manufacturing yield ratio is much improved since the direction of the dislocation line of the threading dislocation 3 is aligned.

Tenth Embodiment

A tenth embodiment of the present invention will be explained. The present embodiment provides to align the direction of the dislocation line of the threading dislocation 3 to be more limited and definitive, compared with the eighth embodiment. Here, the structure of the SiC single crystal epitaxial wafer according to the present embodiment is similar to that of the fifth embodiment. Thus, difference between the present and fifth embodiments will be explained.

In the present embodiment, the angle θ between the direction of the dislocation line and the [0001]-orientation c-axis regarding all of the threading dislocations 3 disposed in the epitaxial film 2 of the SiC single crystal epitaxial wafer having the offset angle α with the offset direction shown in FIG. 4A of the [1-100]-orientation direction is in a range between minus three degrees and plus three degrees with respect to 15 degrees (i.e., the [1-102]-orientation direction).

Thus, the direction of the dislocation line of the threading dislocation 3 is aligned to a specific direction. Accordingly, in addition to the similar effect according to the eighth embodiment, the deviation of the characteristics with respect to the position is reduced so that the manufacturing yield ratio is much improved since the direction of the dislocation line of the threading dislocation 3 is aligned.

Eleventh Embodiment

An eleventh embodiment of the present invention will be explained. The present embodiment provides to align the direction of the dislocation line of the threading dislocation 3 to be more limited and definitive, compared with the eighth embodiment. Here, the structure of the SiC single crystal epitaxial wafer according to the present embodiment is similar to that of the fifth embodiment. Thus, difference between the present and fifth embodiments will be explained.

In the present embodiment, the angle θ between the direction of the dislocation line and the [0001]-orientation c-axis regarding all of the threading dislocations 3 disposed in the epitaxial film 2 of the SiC single crystal epitaxial wafer having the offset angle α with the offset direction shown in FIG. 4A of the [1-100]-orientation direction is in a range between minus three degrees and plus three degrees with respect to 7.6 degrees (i.e., the [1-104]-orientation direction).

Thus, the direction of the dislocation line of the threading dislocation 3 is aligned to a specific direction. Accordingly, in addition to the similar effect according to the eighth embodiment, the deviation of the characteristics with respect to the position is reduced so that the manufacturing yield ratio is much improved since the direction of the dislocation line of the threading dislocation 3 is aligned.

Twelfth Embodiment

A twelfth embodiment of the present invention will be explained. In the first to eleventh embodiments, the dislocation is merely explained as the threading dislocation 3. It is preferred that the threading dislocation 3 may include a threading edge dislocation. When the threading dislocation 3 including the threading edge dislocation is formed, the similar effect to the first to eleventh embodiments is obtained. As shown in FIG. 6, in case of the threading edge dislocation, the failure time of the electric device 4 as a power device such as a diode and a MOS transistor formed in the SiC single crystal epitaxial wafer becomes longer than a case of the threading screw dislocation. Thus, it is possible to provide excellent device characteristics.

Other Embodiments

In the above embodiments, when the epitaxial film 2 is formed on the SiC single crystal substrate 1 by, for example, a CVD method, it is utilized that the direction of the dislocation line of the threading dislocation 3 turns toward a specific direction according to the relationship with the impurity concentration. However, this is merely an example of a method for aligning the direction of the dislocation line of the threading dislocation 3 easily. In view of the device characteristics and the manufacturing yield ratio, when the direction of the dislocation line of the threading dislocation 3 formed in the epitaxial film 2 of the SiC single crystal substrate 1 or the SiC single crystal epitaxial wafer is disposed in an angle range described in the above embodiments, the above effects are obtained. Thus, it is not limited to the manufacturing methods described in the above embodiments.

In the above, embodiments, the SiC single crystal substrate 1 made of hexagonal system 4H—SiC, which is suitable for the power electric device 4, is used. Alternatively, other crystal structure may be applied to the present invention. Here, the index showing the direction of the dislocation line of the threading dislocation 3 may be changed in case of other crystal structures such as 6H—SiC.

In the above embodiments, the substrate, on which the electric device 4 is formed, is the SIC single crystal epitaxial wafer, which is prepared by growing the epitaxial film on the SiC single crystal substrate 1. Alternatively, the SiC single crystal is bulky grown on the epitaxial film 2, and then, the crystal is cut off so that the SiC single crystal substrate having the aligned direction of the threading dislocation 3 is formed. The device may be formed in the SiC single crystal substrate. Accordingly, the present invention is not limited to the SiC single crystal epitaxial wafer, but applied to the SiC single crystal substrate.

When an index represents an orientation of crystal, a bar should be put over a digit under normal circumferences. Because there is constrained expression attributed to computer application, the bar is put in front of the digit in the present description.

The above disclosure has the following aspects.

According to a first aspect of the present disclosure, a silicon carbide single crystal substrate includes: a threading dislocation with a dislocation line, which penetrates a (0001)-plane c-face. An angle between the direction of the dislocation line of the threading dislocation and a [0001]-orientation c-axis is equal to or smaller than 22.5 degrees.

The threading dislocation having the dislocation line in the [0001]-orientation c-axis direction is perpendicular to the direction of the dislocation line of the basal plane dislocation. Thus, the threading dislocation does not provide the extended dislocation on the c-face, and therefore, the stacking fault is not generated. Accordingly, when the SiC single crystal substrate having the direction of the dislocation line of the threading dislocation (3) being equal to the [0001]-orientation c-axis is used, and the electric device is formed in the SiC single crystal substrate, the SiC semiconductor device is formed such that the device characteristics becomes excellent, and the deterioration is reduced and the manufacturing yield ration is improved.

Alternatively, the angle between the direction of the dislocation line of the threading dislocation and the [0001]-orientation c-axis may be in a range between minus three degrees and plus three degrees with a center of a specific direction, which is equal to or smaller than 19.5 degrees. Since the direction of the dislocation line of the threading dislocation is aligned to the specific direction. Accordingly, deviation of characteristics with respect to positions is reduced, and thereby, the manufacturing yield ratio is much improved.

Alternatively, the direction of the dislocation line of the threading dislocation may be in a range between minus three degrees and plus three degrees with a center of a direction in parallel to the [0001]-orientation c-axis. Thus, a composition on the c-face becomes small, and the deterioration of the device characteristics is much reduced.

Alternatively, the direction of the dislocation line of the threading dislocation may be in parallel to the [0001]-orientation c-axis. Thus, the composition on the c-face becomes zero, and the deterioration of the device characteristics is much reduced.

According to a second aspect of the present disclosure, a silicon carbide single crystal epitaxial wafer includes: a silicon carbide single crystal substrate having an offset direction of a [11-20]-orientation direction; and an epitaxial film disposed on the silicon carbide single crystal substrate. The epitaxial film includes a threading dislocation with a dislocation line, which penetrates a (0001)-plane c-face. An angle between the direction of the dislocation line of the threading dislocation and a [0001]-orientation c-axis is in a range between minus three degrees and plus twenty degrees, the angle being defined by a normal direction of a substrate surface along with the [11-20]-orientation direction. The threading dislocation is disposed on a (1-100)-face.

Thus, the direction of the dislocation line of the threading dislocation is aligned, and the angle θ between the direction of the dislocation line of the threading dislocation and the [0001]-orientation c-axis is set to be in arrange between minus three degrees and plus twenty degrees. When the electric device is formed in such a SiC single crystal epitaxial wafer, the device characteristics are excellent. Thus, the deterioration is prevented, and the manufacturing yield ratio is improved. Further, the threading dislocation is on the (1-100)-face, and the dislocation line is aligned to tilt on the same orientation surface. Thus, the deterioration of the device characteristics and the reduction of the manufacturing yield ration are restricted. For example, when the field effect transistor having the channel surface of the (1-100)-face is formed in the SiC single crystal substrate, the dislocation line does not intersect with the channel surface. Accordingly, the characteristics and the reliability of the transistor are much improved.

Alternatively, the angle between the direction of the dislocation line of the threading dislocation and the [0001]-orientation c-axis may be in a range between minus three degrees and plus three degrees with a center of 17 degrees, the angle being defined by the normal direction of the substrate surface along with the [11-20]-orientation direction.

Alternatively, the angle between the direction of the dislocation line of the threading dislocation and the [0001]-orientation c-axis may be in a range between minus three degrees and plus three degrees with a center of 8.7 degrees, the angle being defined by the normal direction of the substrate surface along with the [11-20]-orientation direction.

According to a third aspect of the present disclosure, a silicon carbide single crystal epitaxial wafer includes: a silicon carbide single crystal substrate having an offset direction of a [1-100]-orientation direction; and an epitaxial film disposed on the silicon carbide single crystal substrate. The epitaxial film includes a threading dislocation with a dislocation line, which penetrates a (0001)-plane c-face. An angle between the direction of the dislocation line of the threading dislocation and a [0001]-orientation c-axis is in a range between minus three degrees and plus 22.5 degrees, the angle being defined by a normal direction of a substrate surface along with the [1-100]-orientation direction. The threading dislocation is disposed on a (11-20)-face.

Thus, the direction of the dislocation line of the threading dislocation is aligned, and the angle θ between the direction of the dislocation line of the threading dislocation and the [0001]-orientation c-axis is in a range between minus three degrees and 22.5 degrees. When the electric device is formed in such a SiC single crystal epitaxial wafer, the device characteristics are excellent, the deterioration is restricted, and the manufacturing yield ratio is improved. Further, the threading dislocation is disposed on the (11-20)-face, and the dislocation line is aligned to tilt on the same orientation surface. Thus, the deterioration and the manufacturing yield ratio are restricted. For example, when the field effect transistor having the channel surface of the (11-20)-face is formed in the SiC single crystal substrate, the dislocation line does not intersect with the channel surface. Accordingly, the characteristics and the reliability of the transistor are much improved.

Alternatively, the angle between the direction of the dislocation line of the threading dislocation and the [0001]-orientation c-axis may be in a range between minus three degrees and plus three degrees with a center of 19.5 degrees, the angle being defined by the normal direction of the substrate surface along with the [1-100]-orientation direction.

Alternatively, the angle between the direction of the dislocation line of the threading dislocation and the [0001]-orientation c-axis may be in a range between minus three degrees and plus three degrees with a center of 15 degrees, the angle being defined by the normal direction of the substrate surface along with the [1-100]-orientation direction.

Alternatively, the angle between the direction of the dislocation line of the threading dislocation and the [0001]-orientation c-axis is in a range between minus three degrees and plus three degrees with a center of 7.6 degrees, the angle being defined by the normal direction of the substrate surface along with the [1-100]-orientation direction.

Alternatively, the epitaxial film may have an impurity concentration, which is lower than an impurity concentration of the silicon carbide single crystal substrate, and the impurity concentration of the epitaxial film is equal to or smaller than $1 \times 10^{17}$ cm$^{-3}$. The direction of the threading dislocation in the epitaxial film of the SiC single crystal epitaxial wafer is determined by an impurity concentration, for example. In this case, the direction of the threading dislocation can be specified. In this case, since the impurity concentration of the epitaxial film is smaller than the impurity concentration of the SiC single crystal substrate, the concentration of the epitaxial film is appropriate for the device process.

Alternatively, the threading dislocation may include a threading edge dislocation. Thus, since the dislocation includes the threading edge dislocation, a failure time can be lengthened, compared with a case where the dislocation includes a threading screw dislocation, when an electric device as a power device such as a diode and a MOS transistor is formed in a SiC single crystal epitaxial wafer or a silicon carbide single crystal substrate. Thus, the device characteristics become much excellent.

According to a fourth aspect of the present disclosure, a silicon carbide semiconductor device includes: an electric device disposed in the silicon carbide single crystal substrate or the silicon carbide single crystal epitaxial wafer. The device characteristics become much excellent.

According to a fifth aspect of the present disclosure, a silicon carbide semiconductor device includes: a field effect transistor as an electric device having a channel surface of a (1-100)-face disposed in the silicon carbide single crystal epitaxial wafer. The device characteristics become much excellent.

According to a sixth aspect of the present disclosure, a silicon carbide semiconductor device includes: a field effect transistor as an electric device having a channel surface of a (11-20)-face disposed in the silicon carbide single crystal epitaxial wafer. The device characteristics become much excellent.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A silicon carbide single crystal epitaxial wafer comprising:
    a silicon carbide single crystal substrate having an offset direction of a [11-20]-orientation direction; and
    an epitaxial film disposed on the silicon carbide single crystal substrate,
    wherein the epitaxial film includes a threading dislocation with a dislocation line, which penetrates a (0001)-plane c-face,
    wherein an angle between the direction of the dislocation line of the threading dislocation and a [0001]-orientation c-axis is in a range between minus three degrees and plus twenty degrees,
    wherein a positive sense of the angle is defined by a direction from the c-axis to a normal direction of a substrate surface, the normal direction being arranged between the [11-20]-orientation direction and the c-axis, and
    wherein the threading dislocation is disposed on a (1-100)-face,
    wherein the angle between the direction of the dislocation line of the threading dislocation and the [0001]-orientation c-axis is in a range between minus three degrees and plus three degrees with a center of 17 degrees, and
    wherein a positive sense of the angle is defined by a direction from the c-axis to a normal direction of a substrate surface, the normal direction being arranged between the [11-20]-orientation direction and the c-axis.

2. The silicon carbide single crystal epitaxial wafer according to claim 1,
wherein the epitaxial film has an impurity concentration, which is lower than an impurity concentration of the silicon carbide single crystal substrate, and
wherein the impurity concentration of the epitaxial film is equal to or smaller than 1×1017 cm-3.

3. The silicon carbide single crystal epitaxial wafer according to claim 1,
wherein the threading dislocation includes a threading edge dislocation.

4. A silicon carbide semiconductor device comprising:
an electric device disposed in the silicon carbide single crystal epitaxial wafer according to claim 1.

5. A silicon carbide semiconductor device comprising:
a field effect transistor as an electric device having a channel surface of a (1-100)-face disposed in the silicon carbide single crystal epitaxial wafer according to claim 1.

6. A silicon carbide single crystal epitaxial wafer comprising:
a silicon carbide single crystal substrate having an offset direction of a [11-20]-orientation direction; and
an epitaxial film disposed on the silicon carbide single crystal substrate,
wherein the epitaxial film includes a threading dislocation with a dislocation line, which penetrates a (0001)-plane c-face,
wherein an angle between the direction of the dislocation line of the threading dislocation and a [0001]-orientation c-axis is in a range between minus three degrees and plus twenty degrees,
wherein a positive sense of the angle is defined by a direction from the c-axis to a normal direction of a substrate surface, the normal direction being arranged between the [11-20]-orientation direction and the c-axis,
wherein the threading dislocation is disposed on a (1-100)-face,
wherein the angle between the direction of the dislocation line of the threading dislocation and the [0001]-orientation c-axis is in a range between minus three degrees and plus three degrees with a center of 8.7 degrees, and
wherein a positive sense of the angle is defined by a direction from the c-axis to a normal direction of a substrate surface, the normal direction being arranged between the [11-20]-orientation direction and the c-axis.

7. The silicon carbide single crystal epitaxial wafer according to claim 6,
wherein the epitaxial film has an impurity concentration, which is lower than an impurity concentration of the silicon carbide single crystal substrate, and
wherein the impurity concentration of the epitaxial film is equal to or smaller than 1×1017 cm-3.

8. The silicon carbide single crystal epitaxial wafer according to claim 6,
wherein the threading dislocation includes a threading edge dislocation.

9. A silicon carbide semiconductor device comprising:
an electric device disposed in the silicon carbide single crystal epitaxial wafer according to claim 6.

10. A silicon carbide semiconductor device comprising:
a field effect transistor as an electric device having a channel surface of a (1-100)-face disposed in the silicon carbide single crystal epitaxial wafer according to claim 6.

* * * * *